(12) United States Patent
Maebashi

(10) Patent No.: US 8,523,612 B2
(45) Date of Patent: Sep. 3, 2013

(54) ELECTRIC CONNECTION BOX STRUCTURE

(75) Inventor: Akemi Maebashi, Kakegawa (JP)

(73) Assignee: Yazaki Corporation, Tokyo (JP)

( * ) Notice: Subject to any disclaimer, the term of this patent is extended or adjusted under 35 U.S.C. 154(b) by 736 days.

(21) Appl. No.: 12/588,752

(22) Filed: Oct. 27, 2009

(65) Prior Publication Data

US 2010/0136836 A1    Jun. 3, 2010

(30) Foreign Application Priority Data

Dec. 2, 2008   (JP) .................................. 2008-307232

(51) Int. Cl.
*H01R 13/68*   (2011.01)
(52) U.S. Cl.
USPC ...................................... 439/620.27; 439/76.2
(58) Field of Classification Search
USPC ..................... 439/620.27, 76.2, 206, 485, 949
See application file for complete search history.

(56) References Cited

U.S. PATENT DOCUMENTS

| | | | |
|---|---|---|---|
| 6,761,567 B2 * | 7/2004 | Onizuka et al. | 439/76.2 |
| 6,824,397 B1 * | 11/2004 | Carreras | 439/76.2 |
| 7,137,829 B2 * | 11/2006 | Onizuka et al. | 439/76.2 |
| 7,442,099 B2 * | 10/2008 | Egawa et al. | 439/883 |
| 2005/0020106 A1 * | 1/2005 | Ito | 439/76.2 |
| 2008/0119068 A1 * | 5/2008 | Shimizu et al. | 439/76.2 |

FOREIGN PATENT DOCUMENTS

| | | |
|---|---|---|
| JP | 09-293973 | 11/1997 |
| JP | 2005-269862 | 9/2005 |
| JP | 2007-325465 | 12/2007 |

* cited by examiner

*Primary Examiner* — Michael Zarroli
(74) *Attorney, Agent, or Firm* — Edwards Wildman Palmer LLP

(57) ABSTRACT

The present invention is to provide an electric connection box which can prevent a fuse attaching portion from being heated to high temperature. The electric connection box includes a fuse attaching portion in which a plurality of fuses are directly aligned and attached, a case body having a plurality of the fuse attaching portions on an upper surface thereof, and a hole provided between the fuse attaching portions, the hole passing through the case body from a lower surface to the upper surface thereof. The hole is separated into a small hole smaller than a size of the fuse by a partition wall.

3 Claims, 6 Drawing Sheets

ELECTRIC CONNECTION BOX STRUCTURE

The priority application Number Japan Patent Application No. 2008-307232 upon which this patent application is based is hereby incorporated by reference.

BACKGROUND OF THE INVENTION

1. Filed of the Invention

The present invention relates to an electric connection box mounted in an engine room of a vehicle.

2. Description of the Related Art

In a vehicle, various electronic devices are mounted. In the vehicle, an electric connection box is arranged between a power source and the electronic device so as to supply electrical power to those various electronic devices.

The electric connection box is called a junction block, a fuse block, or a relay box. In the present specification, the above the junction block, the fuse block and the relay box are referred to as an electric connection box.

FIG. 6 is a plan view showing a part of a conventional electric connection box.

An electric connection box 101 shown in FIG. 6 has a case body 102 made of plastics material. In an upper surface 102a of the case body 102, a fuse attaching portion 103 is arranged with a plurality of lines. In the fuse attaching portion 103, a plurality of fuses are directly aligned and attached thereto.

In an upper surface 102a of the case body 102, a fuse attaching portion 103 is arranged with a plurality of lines. In the fuse attaching portion 103, a plurality of fuses are directly aligned and attached thereto. Also, between the fuse attaching portions 103, a bulkhead 104 is arranged and made of synthetic resin material (for example, see the patent document 1). In a lower surface side of the case body 102, that is a lower side of the fuse attaching portion 103, a bus bar or an electric wire, which is electrically connected to a fuse attached to the fuse attaching portion 103, is received.

The above mentioned electric connection box 101 is attached in condition that a plurality of fuses are densely-packed. Thereby, the fuse attaching portion 103 becomes high temperatures by Joule heat generated with fuse element of the fuses. Furthermore, in the lower side of the fuse attaching portion 103, that is the lower surface side of the case body 102, the bus bar or the electric wire, which is electrically connected to a terminal area of the fuse, is densely-packed. Thereby, the case body 102 is filled with heat generated by the bus bar or the electric wire. Additionally, since a space between the fuse attaching portions is blocked by a division wall 104, it is difficult to radiate the heat of the case body 102.

Patent document 1:
Japan published patent application No. 2007-325465

SUMMARY OF THE INVENTION

Objects to be Solved

The present invention is to provide an electric connection box, which can prevent the fuse attaching portion from being heated to high temperature.

According to a first aspect of the present invention, a electric connection box includes a fuse attaching portion in which a plurality of fuses are directly aligned and attached, a case body having a plurality of the fuse attaching portions on an upper surface thereof, and a hole provided between the fuse attaching portions, the hole passing through the case body from a lower surface to the upper surface thereof.

According to a second aspect of the present invention, a partition wall separating the hole into a small hole smaller than a size of the fuse is arranged.

Effect of the Invention

According to the invention, the hole passing to the upper surface of the case body from the lower surface thereof is arranged between the fuse attaching portions. Thereby, heat generated by an electric wire or bus bar received in a lower surface side of the case body passes through the hole, and flows through the upper surface side of the case body. And then, air convection occurs near the fuse attaching portion. Therefore, the heat generated in the fuse attaching portion is dispersed. As a result, the fuse attaching portion is cooled. Therefore, high temperature in the case body can be prevented, and high temperature of the fuse attaching portion can be prevented.

According to the invention, the partition wall separating the hole into the small hole smaller than a size of the fuse is arranged. Thereby, the fuse can be prevented from falling into the hole, and rigidity of the case boy can be improved.

The above and other objects and features of this invention will become more apparent from the following description taken in conjunction with the accompanying drawings.

DESCRIPTION OF THE PREFERRED EMBODIMENT

An electric connection box according to one embodiment of the present invention is explained by referring to FIGS. 1-5.

The electric connection box of the present invention is mounted in an engine room of a vehicle, and supply electric power to various electronic devices mounted in the vehicle. In a specification of the present invention, a junction block, a fuse block and a relay box are referred to as an electric connection box.

Figure 1:
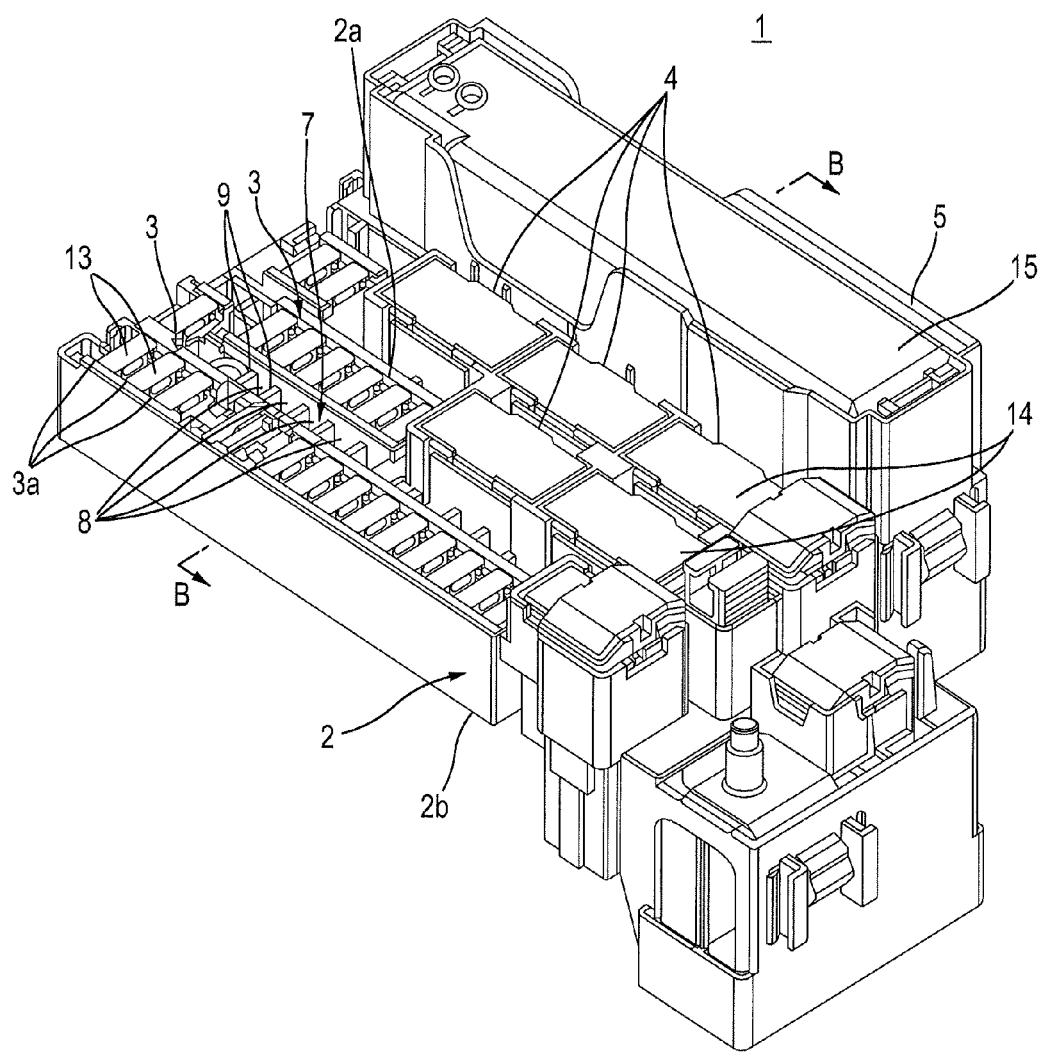
FIG. 1 is a perspective view showing an electric connection box of an embodiment of the present invention.
Figure 2:
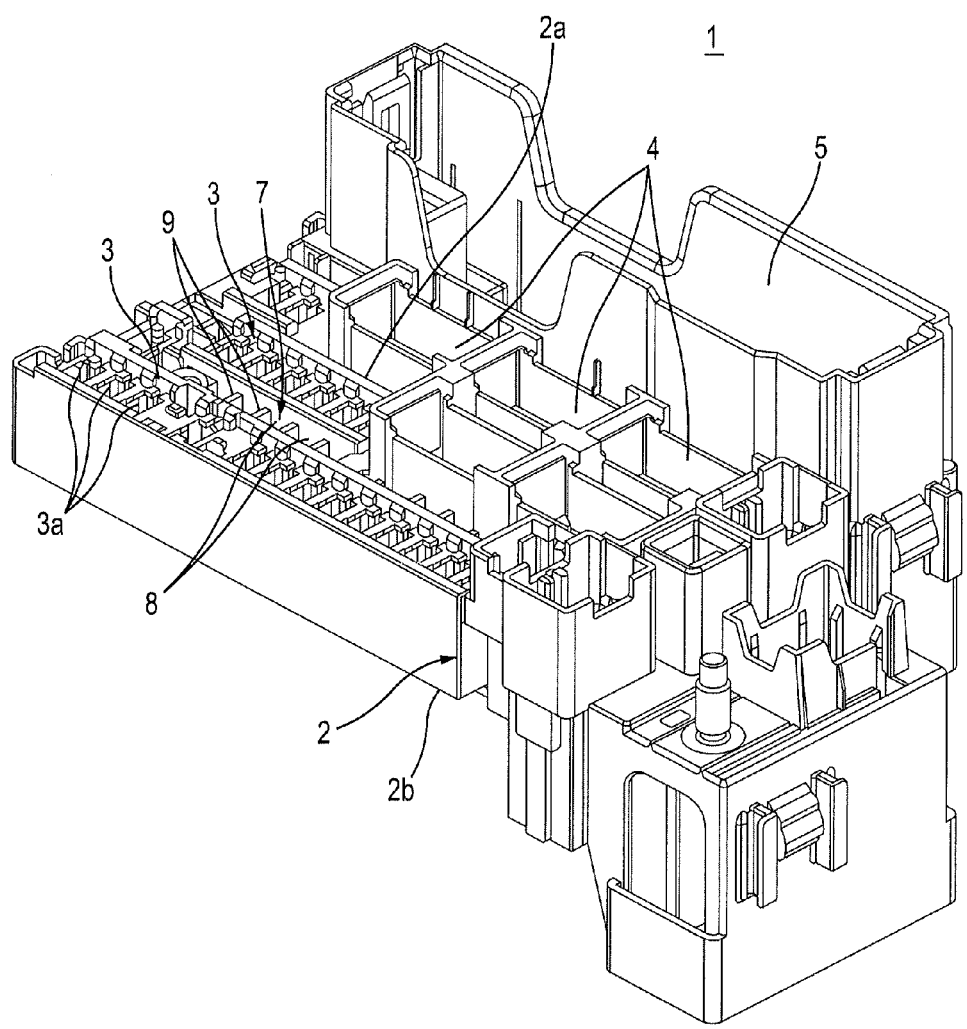
FIG. 2 is a perspective view showing a case body of the electric connection box in FIG. 1.

As shown in FIGS. 1 and 2, the electric connection box 1 includes a case body 2, a fuse 13, a relay 14, a ECU 15, a bus bar 6, an upper cover not shown, and a lower cover not shown. The case body 2 is made of plastics material, and has a plurality of fuse attaching portions 3, a plurality of relay attaching portions 4 and an ECU attaching portions 5. The fuse attaching portion 3, the relay attaching portion 4 and the ECU attaching portion 5 are arranged on an upper surface 2a of the case body 2. The fuse 13 is attached to the fuse attaching portion 3. The relay 14 is attached to the relay attaching portion 4. The ECU 15 is attached to the ECU attaching portion 5. The bus bar 6 is received in a side of a lower surface 2b of the case body 2, and electrically connected to the fuse 13 and terminal areas 13a, 14a of the relay 14. The upper cover covers the upper surface 2a of the case body 2, and the lower cover covers the lower surface 2b of the case body 2.

Figure 5:
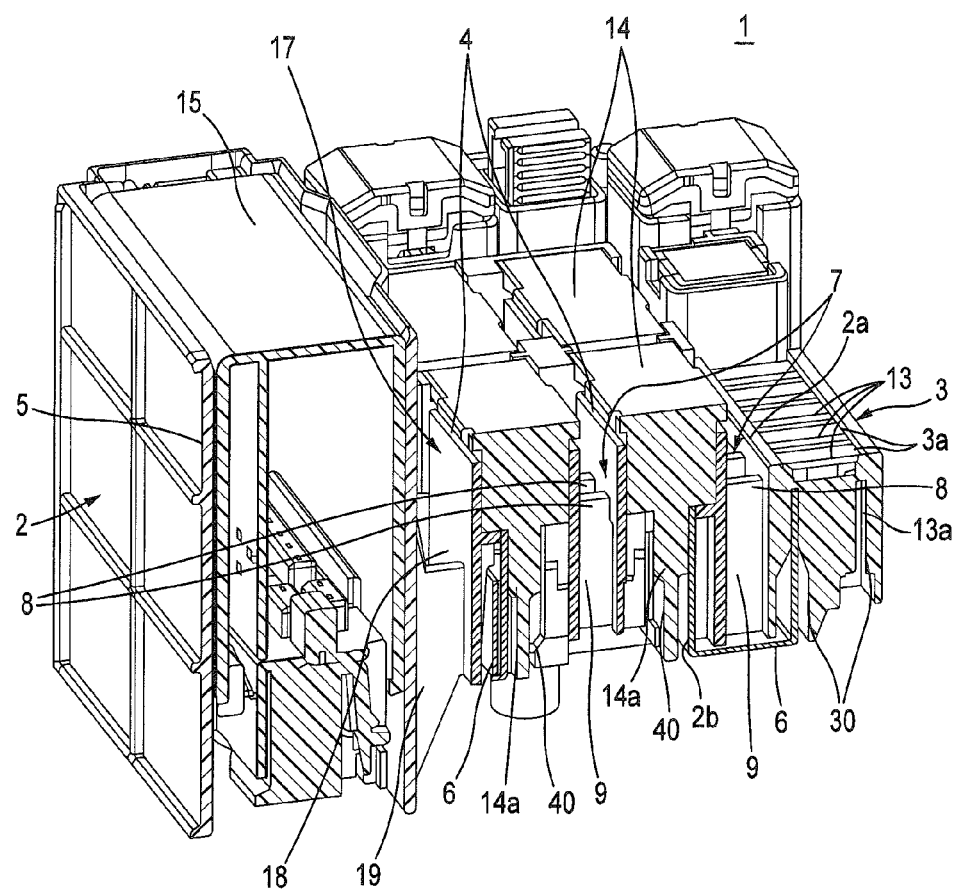
FIG. 5 is a sectional view taken along the line B-B of FIG. 1.
Figure 6:
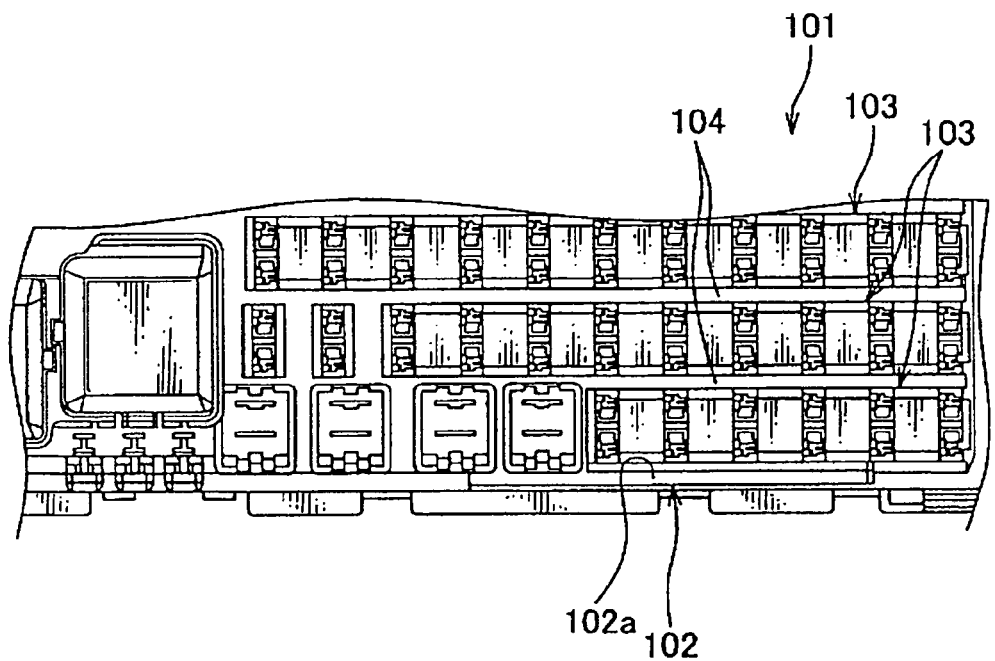
FIG. 6 is a plan view showing a part of a conventional electric connection box.

The fuse attaching portion 3 has a plurality of attaching portions 3a. In the attaching portion 3a, a plurality of the fuses 13 arranged linearly is attached. As shown in FIG. 5, the attaching portion 3a has a plurality of dents 30. The dent 30 is formed into a concave shape, and passes through the lower surface 2b from the upper surface 2a. The above mentioned terminal area 13a of the fuse 13 passes the dent 30 from a side of the upper surface 2a to a side of the lower surface 2b. Furthermore, the terminal area 13a is electrically connected to the bus bar 6 by superimposing with the bus bar 6 received in the lower surface 2b side of the case body 2. The bus bar 6 is formed by pressing a conductive metal plate.

As in the case of the attaching portion 3a, the relay attaching portion 4 has a plurality of dents 40. The dent 40 is formed into a concave shape, and passes through the lower surface 2b from the upper surface 2a. The terminal area 14a of the relay 14 is passed from the upper surface 2a side to the lower surface 2b side in the dent 40. That is, the bus bar 6 is received in the side of the lower surface 2b of the case body 2. Also, the bus bar 6 is received below the fuse attaching portion 3 and the relay attaching portion 4.

Figure 3:
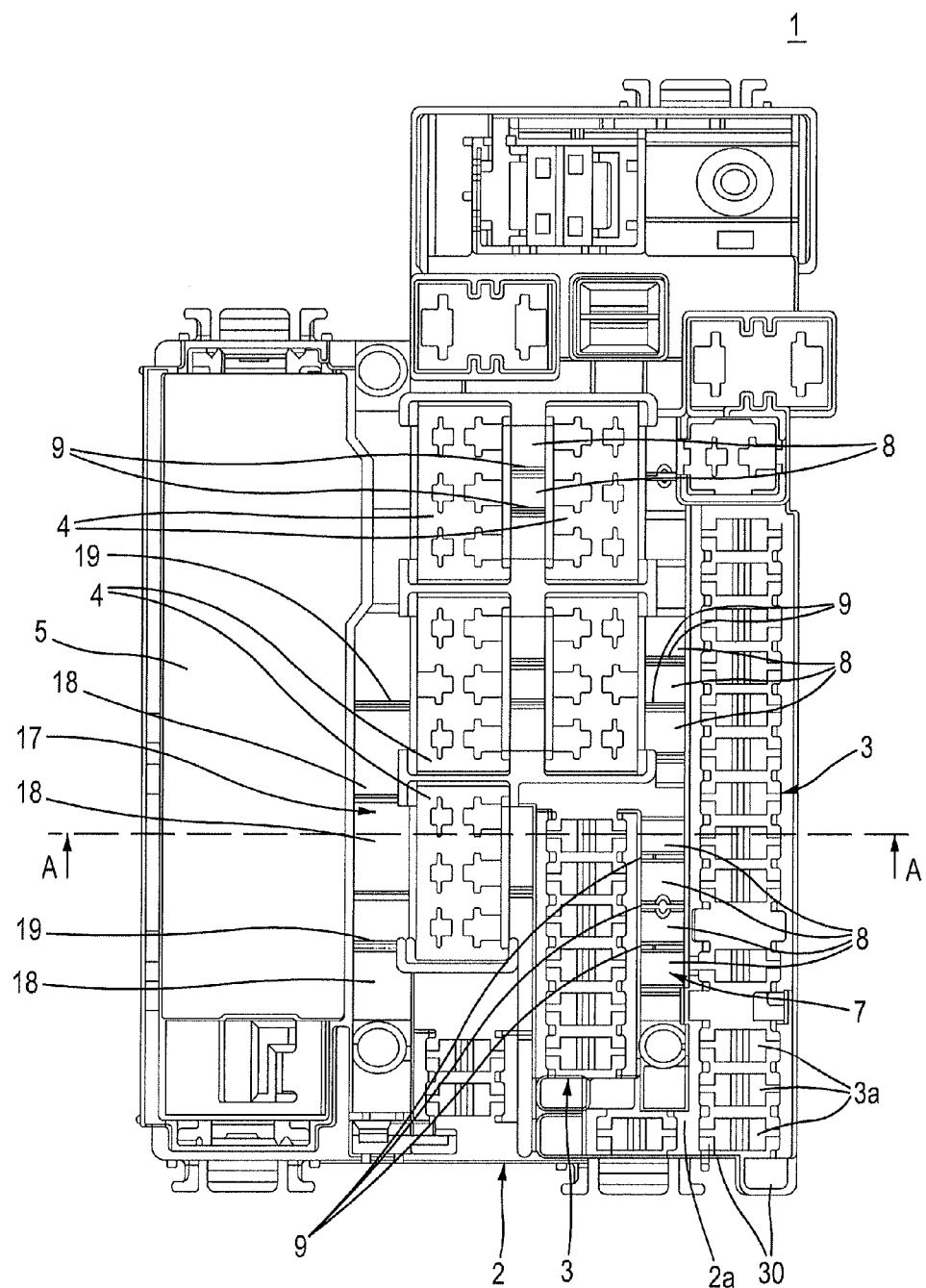
FIG. 3 is a plan view showing an upper surface of the case body in FIG. 2.
Figure 4:
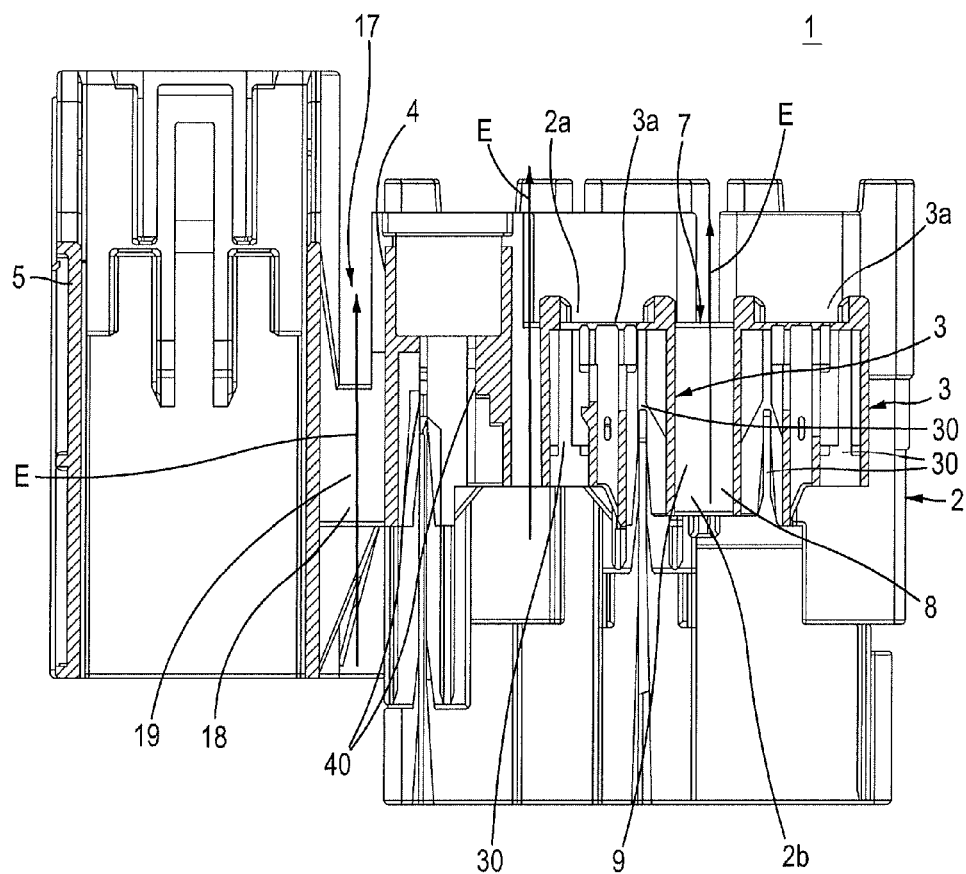
FIG. 4 is a sectional view taken along the line A-A of FIG. 3.

As shown in FIG. 3, a hole 7 is arranged between the fuse attaching portions 3. The hole 7 passes through the upper surface 2a of the case body 2 from the lower surface 2b thereof. Furthermore, a partition wall 9 is arranged at the hole 7. The partition wall 9 divides the hole 7 into a small hole 8 smaller than a size of the fuse 13. The above small hole 8 and partition wall 9 are arranged between the relay attaching portion 4 and the fuse attaching portion 3, and between the relay attaching portions 4. Moreover, a groove 17 is arranged between the relay attaching portion 4 and the ECU attaching portion 5. The groove 17 passes through the upper surface 2a of the case body 2 from the lower surface 2b thereof. In the groove 17, a partition wall 19 is arranged. The partition wall 19 divides the groove 17 into a plurality of a small groove 18.

In the above constructive electric connection box 1, as shown in a arrow E of FIG. 7, the heat which is generated by the bus bar 6 passes through the hole 7, and then is released to the side of the upper surface 2a of the case body 2. Thereby, air convection occurs near the fuse attaching portion 3. As a result, the heat generated in the fuse attaching portion 3 is dispersed, and the fuse attaching portion 3 is cooled. Therefore, high temperature in the case body 2 can be prevented, and high temperature of the fuse attaching portion 3 can be prevented. Also, by the occurrence of the air convection, heat of the electric connection box 1 is uniformed.

In the electric connection box 1, a plurality of the partition walls 9 separating the hole 7 into the small hole 8 is arranged. Thereby, the fuse 13 can be prevented from falling into the hole 7 when a part is replaced. Furthermore, rigidity of the case body 2 can be improved.

Additionally, in the electric connection box 1, the groove 17 is arranged as well as the hole 7. Thereby, high temperature of the case body 2 can be more prevented, and the heat of the electric connection box 1 is more uniformed.

While, in the embodiment, the present invention is described, it is not limited thereto. Various change and modifications can be made with the scope of the present invention.

What is claimed is:

1. An electric connection box comprising:
   a fuse attaching portion in which a plurality of fuses are directly aligned and attached;
   a case body having a plurality of the fuse attaching portions on an upper surface thereof; and
   a hole provided between the fuse attaching portions, the hole passing through the case body from a lower surface to the upper surface thereof,
   wherein a plurality of partition walls separate the hole into a plurality of smaller holes.

2. The electric connection box as claimed in claim 1, wherein a partition wall separating the hole into a small hole smaller than a size of the fuse is arranged.

3. The electric connection box as claimed in claim 1, wherein the fuse attaching portions are arranged parallel to each other with the hole, having a plurality of partition walls forming a plurality of smaller holes, therebetween.

* * * * *